US012140980B2

(12) United States Patent
Toyomasu et al.

(10) Patent No.: US 12,140,980 B2
(45) Date of Patent: Nov. 12, 2024

(54) APPARATUS FOR SUPPLYING LIQUID, CLEANING UNIT, AND APPARATUS FOR PROCESSING SUBSTRATE

(71) Applicant: EBARA CORPORATION, Tokyo (JP)

(72) Inventors: Fujihiko Toyomasu, Tokyo (JP); Junji Kunisawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 487 days.

(21) Appl. No.: 17/599,324

(22) PCT Filed: Mar. 25, 2020

(86) PCT No.: PCT/JP2020/013257
§ 371 (c)(1),
(2) Date: Sep. 28, 2021

(87) PCT Pub. No.: WO2020/209064
PCT Pub. Date: Oct. 15, 2020

(65) Prior Publication Data
US 2022/0187856 A1     Jun. 16, 2022

(30) Foreign Application Priority Data
Apr. 9, 2019   (JP) .................. 2019-074141

(51) Int. Cl.
*G05D 7/06* (2006.01)
*B08B 3/08* (2006.01)
(Continued)

(52) U.S. Cl.
CPC .......... *G05D 7/0623* (2013.01); *B08B 3/08* (2013.01); *B08B 9/0325* (2013.01); *B08B 13/00* (2013.01); *B24B 37/04* (2013.01); *G05D 7/0652* (2013.01)

(58) Field of Classification Search
None
See application file for complete search history.

(56) References Cited

U.S. PATENT DOCUMENTS

2004/0112410 A1   6/2004   Araki et al.
2012/0260952 A1   10/2012  Nonaka
(Continued)

FOREIGN PATENT DOCUMENTS

| JP | H11-000627 A | 1/1999 |
| JP | 2004-193329 A | 7/2004 |

(Continued)

OTHER PUBLICATIONS

JP 2018-98452 English translation, accessed on Feb. 2024. (Year: 2018).*

(Continued)

*Primary Examiner* — Eric W Golightly
*Assistant Examiner* — Arlyn I Rivera-Cordero
(74) *Attorney, Agent, or Firm* — BakerHostetler (57) ABSTRACT

There is provided an apparatus for supplying liquid, comprising a flow controller configured to measure a flow rate of a liquid and control the flow rate based on a measurement value; a first valve connected with the flow controller to control supply of a first liquid to the flow controller; a second valve connected with the flow controller to control supply of a second liquid to the flow controller; and a control device configured to control the first valve and the second valve, wherein the control device switches over the first valve and the second valve with providing a delay time between an open/closed switchover time of the first valve and an open/closed switchover time of the second valve.

16 Claims, 3 Drawing Sheets

(51) Int. Cl.
    *B08B 9/032*     (2006.01)
    *B08B 13/00*     (2006.01)
    *B24B 37/04*     (2012.01)

(56) References Cited

U.S. PATENT DOCUMENTS

| | | | |
|---|---|---|---|
| 2015/0357208 A1 | 12/2015 | Toyomasu et al. | |
| 2018/0281026 A1 | 10/2018 | Toyomasu et al. | |
| 2018/0350636 A1* | 12/2018 | Fukuda | H01L 21/6708 |
| 2019/0314951 A1 | 10/2019 | Xu et al. | |

FOREIGN PATENT DOCUMENTS

| | | | | |
|---|---|---|---|---|
| JP | 2005-302571 A | | 10/2005 | |
| JP | 2012-222237 A | | 11/2012 | |
| JP | 2014-236079 | * | 12/2014 | ........... H01L 21/304 |
| JP | 2016-015469 A | | 1/2016 | |
| JP | 2017-177303 A | | 10/2017 | |
| JP | 2017-183515 A | | 10/2017 | |
| JP | 2018-098452 A | | 6/2018 | |
| JP | 2018-181883 A | | 11/2018 | |

OTHER PUBLICATIONS

JP 2014-236079 English translation, accessed on Feb. 2024. (Year: 2014).*

International Patent Application No. PCT/JP2020/013257; Int'l Search Report; dated Jun. 23, 2020; 3 pages.

* cited by examiner

Fig. 5

APPARATUS FOR SUPPLYING LIQUID, CLEANING UNIT, AND APPARATUS FOR PROCESSING SUBSTRATE

TECHNICAL FIELD

The present disclosure relates to an apparatus for supplying liquid, a cleaning unit and an apparatus for processing a substrate.

BACKGROUND ART

A substrate processing apparatus, for example, a semiconductor manufacturing apparatus, is configured to perform liquid treatments including a cleaning process, a plating process, an etching process, a polishing process and a developing process. In a liquid supply apparatus relating to these liquid treatments, for example, pipe cleaning (flushing) with pure water and liquid treatment such as dilution or mixing of chemicals or the like are performed. Such liquid treatments include a process of switching over a line for supplying a liquid by means of a valve and supplying the liquid to an output side and/or a process of diluting or mixing liquids from a plurality of lines by opening and closing of valves. For example, a CMP (Chemical Mechanical Polishing) apparatus includes a polishing apparatus configured to polish the surface of a semiconductor substrate with a semiconductor chip formed thereon and a cleaning unit configured to supply a cleaning chemical to the semiconductor substrate polished by the polishing apparatus and clean the semiconductor substrate with the cleaning chemical. The cleaning unit includes a liquid supply apparatus and a cleaning apparatus configured to receive supply of the cleaning chemical from the liquid supply apparatus. The liquid supply apparatus produces a cleaning chemical (diluted chemical) by mixing a chemical with diluting water such as DIW (De-Ionized Water). The cleaning apparatus cleans the semiconductor substrate by using the cleaning chemical (as described in, for example, Patent Document 1).

CITATION LIST

Patent Document

Patent Document 1: Japanese Unexamined Patent Publication No. 2018-181883

SUMMARY OF INVENTION

Technical Problem

There has been a demand for downsizing the liquid supply apparatus described above. Downsizing the liquid supply apparatus shortens a distance between respective components (a valve, a pressure gauge, and a flow control valve). It has been found that shortening the distance between the respective components and reducing the volume in a piping or in a flow path between the respective components are likely to cause an overshoot of a detection value of a sensor such as a flowmeter and cause a measurement value upper limit error (a pressure upper limit error, a flow rate upper limit error or the like). Such an increase in the internal pressure of the piping may be attributed to the distance between the respective components. This is likely to cause a problem in the case of downsizing the liquid supply apparatus.

An object of the present disclosure is to solve at least part of the problems described above.

Solution to Problem

According to one aspect, there is provided an apparatus for supplying liquid, comprising a flow controller configured to measure a flow rate of a liquid and control the flow rate based on a measurement value; a first valve connected with the flow controller to control supply of a first liquid to the flow controller; a second valve connected with the flow controller to control supply of a second liquid to the flow controller; and a control device configured to control the first valve and the second valve, wherein the control device switches over the first valve and the second valve with providing a delay time between an open/closed switchover time of the first valve and an open/closed switchover time of the second valve.

DESCRIPTION OF EMBODIMENTS

The following describes embodiments of the present disclosure with reference to drawings. In the drawings described below, identical or equivalent components are expressed by identical reference signs, and duplicated description is omitted. The following describes a chemical supply apparatus of a cleaning apparatus as one example of the apparatus for supplying liquid. The present disclosure is, however, not limited to this embodiment but includes any liquid supply apparatus that is usable for liquid treatment in an apparatus for processing a substrate. In the description below, DIW (De-Ionized Water) is used as one example of pure water, but water other than DIW may be used alternatively.

Figure 1:
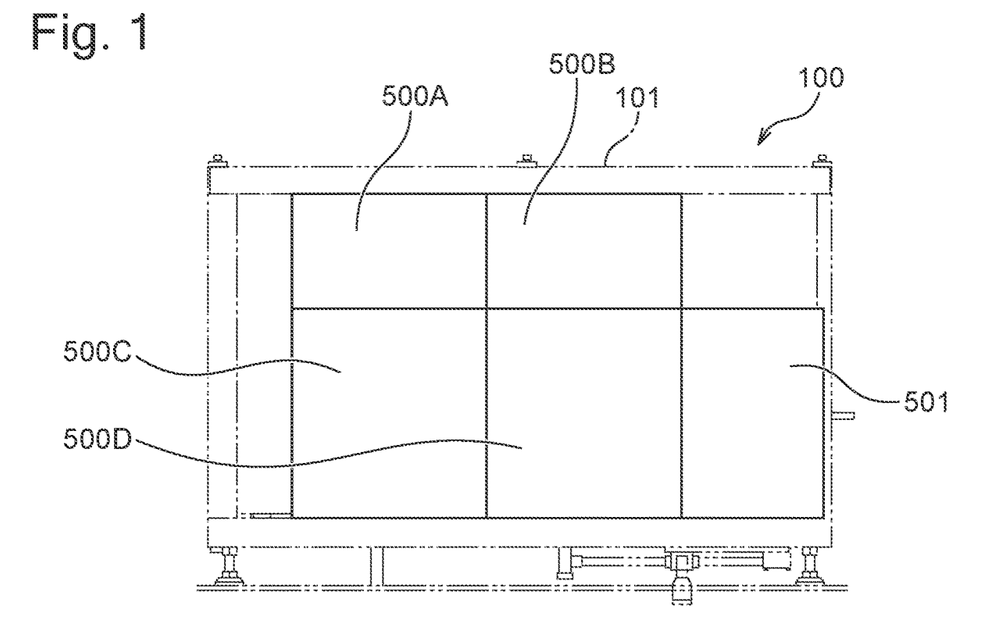
FIG. 1 is a schematic front view illustrating a liquid supply apparatus according to one embodiment.
Figure 2:
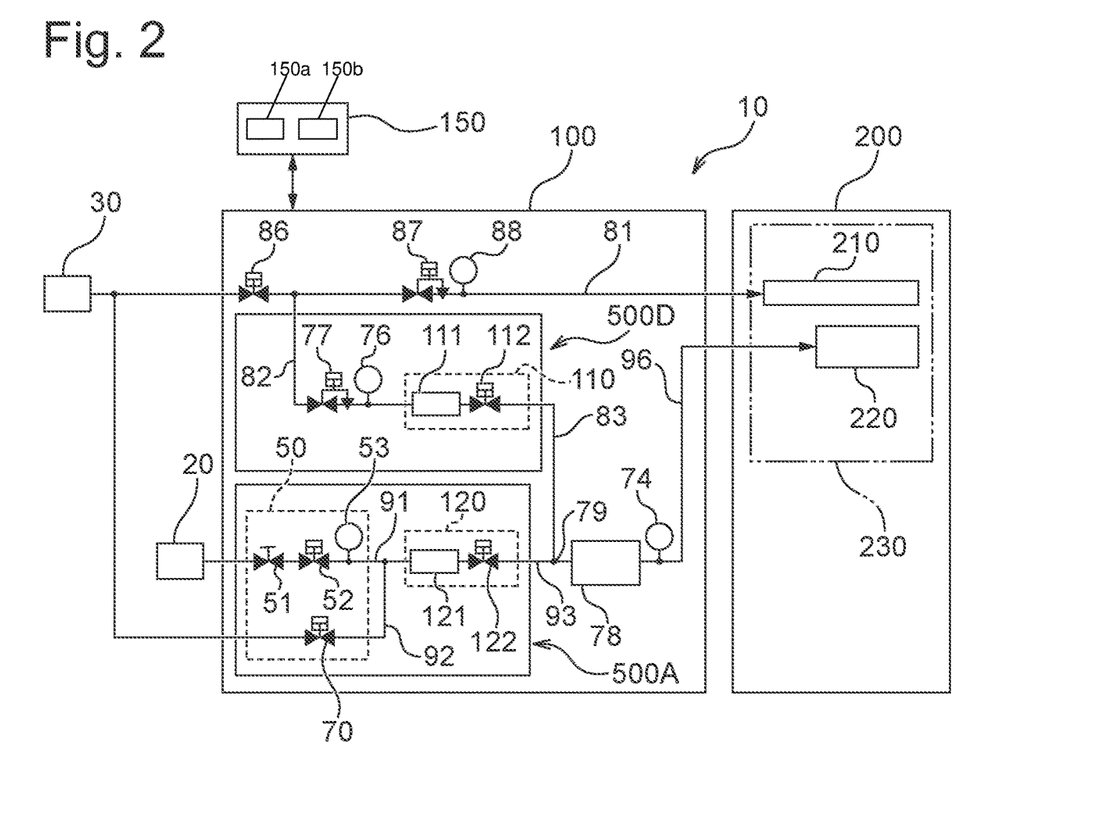
FIG. 2 is a fluid circuit diagram of the liquid supply apparatus according to one embodiment.

FIG. 1 is a schematic front view illustrating a liquid supply apparatus 100 according to one embodiment. FIG. 2 is a fluid circuit diagram of the liquid supply apparatus 100 according to one embodiment. This embodiment describes a chemical supply apparatus of a cleaning unit 10 as one example of the liquid supply apparatus 100. In the description below, this is referred to as the chemical supply apparatus 100. The cleaning unit 10 includes the chemical supply apparatus 100 and a cleaning apparatus 200 configured to receive a supply of a cleaning chemical from the chemical supply apparatus 100. The cleaning unit 10 is a cleaning unit used in a post cleaning process subsequent to, for example, a polishing process such as CMP, a plating process, an etching process, or a developing process and is provided integrally or separately with a polishing apparatus, a plating apparatus, an etching apparatus or a developing apparatus.

The chemical supply apparatus 100 is configured to supply an acidic or alkaline chemical to the cleaning apparatus 200. The chemical may be at ordinary temperature or at high temperature (for example, temperature of approximately 80 degrees Celsius). As shown in FIG. 1, the chemical supply apparatus 100 includes a housing 101; chemical utility boxes 500A to 500C, each including a flow controller (in this embodiment, a chemical CLC 121 described later); a DIW utility box 500D including a flow controller (in this embodiment, a DIW CLC 111 described later); and an equipment area 501 where other equipment such as valves, regulators and pressure gauges are placed. This embodiment is described with referring to a CLC (Closed loop Controller) as an example of the flow controller. The flow controller may, however, be a flow controller having a configuration other than the CLC. The chemical utility boxes 500A to 500C, the DIW utility box 500D and the equipment area 501 are placed inside of the housing 101. The chemical supply apparatus 100 includes piping (flow paths) configured to transport DIW or the chemical, valves, pressure gauges and the like. The details are described with reference to FIG. 2. In this embodiment, five utility boxes are provided in the chemical supply apparatus 100. This configuration is, however, only an example. The number of the utility boxes and/or the types of the respective utility boxes (the chemical utility box and the DIW utility box) are appropriately changed according to the specification of the cleaning apparatus.

Figure 3:
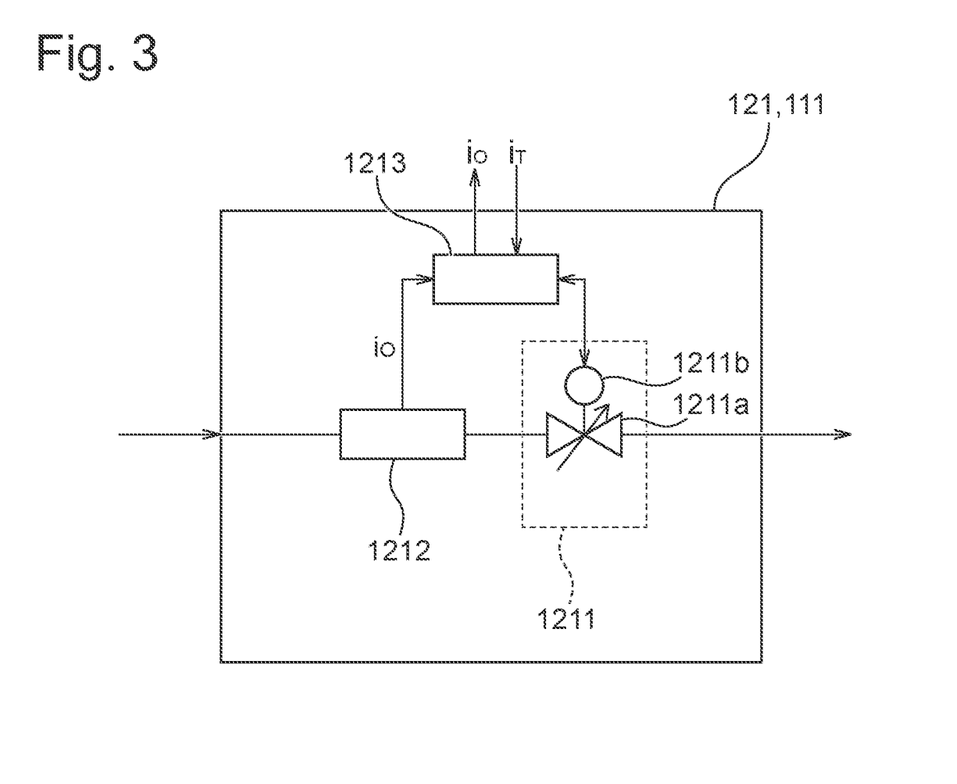
FIG. 3 is a configuration diagram illustrating the configuration of a flow controller according to one embodiment.

FIG. 2 illustrates only the chemical utility box 500A as one example of the chemical utility box. The chemical utility boxes 500A to 500C have substantially the same configuration, so that the following describes the chemical utility box 500A with omitting the description of the other chemical utility boxes. In the case of using a plurality of different chemicals and/or a plurality of different lines of chemicals, a plurality of chemical utility boxes are used. The chemical utility box 500A is configured to supply a chemical from a chemical supply source 20 to an inline mixer 78 described later (as shown in FIG. 2). Furthermore, the chemical utility box 500A is configured to control the flow rate of the chemical to a set flow rate by feedback control. The DIW utility box 500D is configured to supply DIW from a DIW supply source 30 to the inline mixer 78 described later (as shown in FIG. 3). Furthermore, the DIW utility box 500D is configured to control the flow rate of the DIW to a set flow rate by feedback control.

As shown in FIG. 2, the chemical supply apparatus 100 is configured to be in fluid communication with the DIW supply source 30 for supplying the DIW and with the chemical supply source 20 for supplying the chemical, via pipes, respectively. The chemical supply apparatus 100 is also configured to be in fluid communication with the cleaning apparatus 200. More specifically, the chemical supply apparatus 100 serves to supply DIW and a diluted chemical (cleaning chemical) to the cleaning apparatus 200.

The cleaning apparatus 200 includes a DIW cleaning module 210 configured to clean a cleaning object, such as a semiconductor substrate or a glass substrate (FPD), polished by a polishing apparatus, with the DIW; and a chemical cleaning module 220 configured to clean the cleaning object, such as the semiconductor substrate or the glass substrate (FPD), polished by the polishing apparatus, with the diluted chemical (cleaning chemical). The DIW cleaning module 210 is configured by, for example, an ultrasonic water cleaner or another DIW cleaner. The chemical cleaning module 220 is configured by, for example, a roll-type cleaner. These DIW cleaning module 210 and chemical cleaning module 220 are placed together in an identical cleaning tank 230. The cleaning apparatus 200 is usable to clean substrates after film formation (substrates after plating), as well as substrates prior to film formation (substrates with patterns exposed). The cleaning apparatus 200 may be configured to clean any cleaning object other than the semiconductor substrate or the glass substrate (FPD).

The chemical supply apparatus 100 includes the inline mixture 78, the chemical utility box 500, and the DIW utility box 500D. The inline mixer 78 mixes the chemical with the DIW to produce the cleaning chemical. The chemical utility boxy 500A controls the flow rate of the chemical supplied from the chemical supply source 20 to the inline mixture 78 by feedback control. The DIW utility box 500D controls the flow rate of the DIW supplied from the DIW supply source 30 to the inline mixer 78 by feedback control. A control device 150 controls the respective portions of the chemical supply apparatus 100 and the cleaning apparatus 200.

The control device 150 may be, for example, a control device provided with respect to the chemical supply apparatus 100, may be a control device provided with respect to the cleaning unit 10, or may be a control device provided with respect to a substrate processing apparatus (a polishing apparatus or the like) where the cleaning unit 10 is provided. The control device 150 includes a computer, such as a microcomputer or a sequencer, or a control circuit 150a and a recording medium 150b (one or a plurality of memories, such as volatile memories or non-volatile (non-transitory) memories) where programs to be executed by the control circuit 150a are stored. The programs include, for example, a program configured to perform supply and cleaning of the chemical (diluted chemical) by the chemical supply apparatus 100 and the cleaning apparatus 200. The respective portions of the chemical supply apparatus 100 and the cleaning apparatus 200 are controlled according to this program. According to one embodiment, this program may be configured to perform opening and closing operations of a plurality of valves with referring to a recipe of the opening and closing operations of the valves recorded in the recording medium 150b of the control device 150. The programs may be stored in a recording medium (a CD, a flash memory or the like) attachable to and detachable from the control device 150. The programs may also be stored in a recording medium which the control device 150 is accessible to and reads from by wire or wirelessly. The control device 150 may include one or a plurality of control devices among, for example, a control device provided with respect to the chemical supply apparatus 100, a control device provided with respect to the cleaning unit 10 and a control device provided with respect to a substrate processing apparatus (a polishing apparatus or the like) where the cleaning unit 10 is provided.

(DIW Utility Box)

The DIW utility box 500D includes a DIW supply valve 112, a DIW CLC 111 (one example of the flow controller), a pressure gauge 76, and a DIW pressure control regulator 77. The DIW supply valve 112 is controlled open and close by the control device 150 to switch over between ON and OFF of supply of the DIW from the DIW CLC 111 to the inline mixer 78. The DIW CLC 111 is a flow control valve having a closed loop control function and is controlled by the control device 150 to measure the flow rate of the DIW supplied to the inline mixer 78 and control the flow rate on the basis of this measurement value. More specifically, the DIW CLC 111 regulates the opening position of an internal control valve inside of the DIW CLC 111 (by feedback control), based on the measured flow rate of the DIW, such as to make the flow rate of the DIW flowing in the DIW CLC 111 equal to a desired flow rate. The DIW utility box 500D opens the DIW supply valve 112 to supply the DIW to the inline mixer 78. The DIW pressure control regulator 77 has an opening position controlled by the control device 150 to regulate the supply pressure of the DIW from a DIW supply pipe 81 to the DIW CLC 111. The pressure gauge 76 is placed between the DIW pressure control regulator 77 and the DIW CLC 111 to measure the pressure of the DIW flowing into the DIW CLC 111 and output the measurement value to the control device 150.

In FIG. 2, a reference sign 110 indicates a range included in a CLC box (the DIW supply valve 112 and the DIW CLC 111) when the CLC box is provided as a separate box (module) separately from the pressure gauge 76 and the DIW pressure control regulator 77. According to the embodiment, the CLC box 110, the pressure gauge 76 and the DIW pressure control regulator 77 that have conventionally been placed separately (as shown in, for example, FIG. 1 and FIG. 2 of Patent Document 1) are integrated in the DIW utility box 500D provided as one module. The integrated configuration into one DIW utility box 500D integrates pipes connecting the CLC box with the respective components in one single module and achieves downsizing of the liquid supply apparatus. The embodiment may, however, be also applied to a non-integrated configuration into one module.

The chemical supply apparatus 100 includes the DIW supply pipe 81 having one end connected with the DIW supply source 30 and the other end connected with the DIW cleaning module 210 of the cleaning apparatus 200. The DIW supply pipe 81 is provided with a DIW supply valve 86, a DIW pressure control regulator 87, and a DIW pressure gauge 88. The DIW supply valve 86 is controlled open and close by the control device 150 to control supply of the DIW from the DIW supply source 30 to the DIW supply pipe 81. The DIW pressure control regulator 87 has an opening position controlled by the control device 150 to regulate the supply pressure of the DIW from the DIW supply pipe 81 to the DIW cleaning module 210. The DIW pressure gauge 88 measures the pressure of the DIW passing through inside of the DIW supply pipe 81 and outputs the measurement value to the control device 150.

One end of a DIW branch pipe 82 is connected between the DIW supply valve 86 and the DIW pressure control regulator 87 on the DIW supply pipe 81. The other end of the DIW branch pipe 82 is connected with the DIW CLC 111 of the DIW utility box 500D via the DIW pressure control regulator 77 and the pressure gauge 76. One end of a DIW pipe 83 is connected with the DIW CLC 111. The other end of the DIW pipe 83 is connected with a chemical pipe 93 at a meeting point 79 to be in fluid communication with the inline mixer 78. The meeting point 79 is a point where the DIW from the DIW CLC 111 meets with the chemical from the chemical CLC 121. The DIW supply valve 112 is provided on the DIW pipe 83 and is controlled open and close by the control device 150 in the case of supplying the DIW to the inline mixer 78.

(Chemical Utility Box)

The chemical utility box 500A includes a chemical supply valve 122 and a chemical CLC 121 (one example of the flow controller). The chemical utility box 500A also includes a manual valve 51 provided on a chemical pipe 91 connecting the chemical supply source 20 with the chemical CLC 121, a chemical inlet valve 52 configured to switch over between ON and OFF of supply of the chemical to the chemical CLC 121, and a pressure gauge 53 configured to measure the fluid pressure in the chemical pipe 91. The chemical utility box 500A further includes a DIW inlet valve 70 provided on a DIW pipe 92 connecting the DIW supply source 30 with the chemical CLC 121. In FIG. 2, reference signs 120 and 50 respectively indicate components included in a CLC box and in a chemical utility box when the respective boxes are provided separately. According to the embodiment, components placed in separate boxes (modules) of the CLC box 120 and the chemical utility box 50 (for example, components of reference signs 120 and 50 in FIG. 1 of Patent Document 1) are integrated into the chemical utility box 500A provided as one module. The integrated configuration into one chemical utility box 500A integrates pipes between the respective boxes (modules) in one single box and achieves downsizing of the liquid supply apparatus. A valve switchover process of the embodiment described later is especially effective in such an integrated configuration. The embodiment may, however, be also applied to another configuration including a configuration that the components are placed in separate modules of the CLC box 120 and the chemical utility box 50. The manual valve 51 may be placed outside of the chemical utility box 500A.

The chemical supply valve 122 is controlled open and close by the control device 150 to switch over between ON and OFF of supply of the chemical from the chemical CLC 121 to the inline mixer 78. The chemical CLC 121 is a flow control valve having a closed loop control function and is controlled by the control device 150 to measure the flow rate of the chemical supplied to the inline mixer 78 via the chemical supply valve 122 and control the flow rate on the basis of this measurement value. More specifically, the chemical CLC 121 regulates the opening position of an internal control valve inside of the chemical CLC 121 (by feedback control), based on the measured flow rate of the chemical, such as to make the flow rate of the chemical flowing in the chemical CLC 121 equal to a desired flow rate.

The manual valve 51 is a valve that is opened and closed manually and is used, for example, in the case of separating the chemical supply source 20 from the cleaning chemical supply apparatus 100 at the time of a maintenance. The chemical inlet valve 52 is controlled open and close by the control device 150 to control supply of the chemical from the chemical supply source 20 to the chemical CLC 121. The pressure gauge 53 is configured to measure an IN-side (primary side) pressure of the chemical CLC 121, i.e., the supply pressure of the chemical from the chemical supply source 20. The pressure gauge 53 measures the pressure of the chemical flowing into the chemical CLC 121 and outputs the measurement value to the control device 150. The pressure gauge 53 may be placed between the manual valve 51 and the chemical inlet valve 52. A configuration that the pressure gauge 53 is placed between the chemical inlet valve 52 and the chemical CLC 121 like FIG. 2 enables the supply pressure of the chemical from the chemical supply source 20 to be measured in the state that the chemical inlet valve 52 is opened and the DIW inlet valve 70 is closed, and also enables the supply pressure of the DIW from the DIW supply source 30 to be measured in the state that the chemical inlet valve 52 is closed and the DIW inlet valve 70 is opened. A pressure gauge used to measure the supply pressure of the chemical from the chemical supply source 20 and a pressure gauge used to measure the supply pressure of the DIW from the DIW supply source 30 may be provided separately, for example, in the chemical pipe 91 and in the DIW pipe 92. Other than these configurations, one or a plurality of pressure gauges may be provided to measure the supply pressure of the chemical from the chemical supply source 20 and/or the supply pressure of the DIW from the DIW supply source 30.

The DIW inlet valve 70 is controlled open and close by the control device 150 to control supply of the DIW from the DIW supply source 30 to the chemical CLC 121. The pipe 92 is connected with the chemical pipe 91 on an inlet side of the chemical CLC 121. In other words, an IN-side of the chemical CLC 121 is connected with the chemical supply source 20 via the chemical pipe 91 and is connected with the DIW supply source 30 via the DIW pipe 92. As described later, the chemical inlet valve 52 and the DIW inlet valve 70 enable the liquid supplied to the IN-side of the chemical CLC 121 to be switched over between the chemical and the DIW. For example, in the case of performing pipe cleaning (flushing), in the state that the chemical inlet valve 52 is closed and the DIW inlet valve 70 is opened, the DIW is supplied to the chemical CLC 121 to clean the piping on the chemical supply flow path.

The chemical pipe 93 provided to be in fluid communication with the inline mixer 78 is connected with the chemical CLC 121 of the chemical utility box 500A. The chemical supply valve 122 is provided on the chemical pipe 93 and is controlled open and close by the control device 150 in the process of supplying the chemical to the inline mixer 78. The inline mixer 78 is also connected with a cleaning chemical pipe 96 that has one end connected with the chemical cleaning module 220. A pressure gauge 74 is provided on an OUT-side (secondary side) of the inline mixer 78. The DIW from the DIW CLC 111 of the DIW utility box 500D and the chemical from the chemical CLC 121 of the chemical utility box 500A join together at the meeting point 79 of the DIW pipe 83 and the chemical pipe 93. This causes an OUT-side (secondary side) pressure of the DIW CLC 111 to become equal to an OUT-side pressure of the chemical CLC 121. This pressure gauge 74 can thus measure the OUT-side pressure of the DIW CLC 111 and the OUT-side pressure of the chemical CLC 121. In other words, the pressure gauge 74 measures the pressure of the liquid flowing out from the DIW CLC 111 and the pressure of the liquid flowing out from the chemical CLC 121 and outputs the measurement values to the control device 150.

Each of the DIW CLC 111 of the DIW utility box 500D and the chemical CLC 121 of the chemical utility box 500A is configured to receive a signal (flow rate set value) indicating a predetermined flow rate set value from the control device 150. The opening position of the internal control valve of each of the DIW CLC 111 and the chemical CLC 121 is controlled, based on this flow rate set value.

FIG. 3 is a configuration diagram illustrating the configuration of a flow controller according to one embodiment. The chemical CLC 121 is illustrated in FIG. 3 as one example of the liquid controller. The configuration of the DIW CLC 111 is similar to the configuration of the chemical CLC 121, and the following describes the chemical CLC 121 as an example. The chemical CLC 121 includes a flowmeter 1212, a flow control valve (internal control valve) 1211, and a controller 1213. The flowmeter 1212 of the chemical CLC 121 is, for example, a differential pressure-type flowmeter (orifice flowmeter). The differential pressure-type flowmeter is a flowmeter configured to detect a pressure difference between an IN side and an OUT side of the flowmeter and measure a flow rate based on this pressure difference. An ultrasonic flowmeter may be employed for the flowmeter 1212. According to the embodiment, the flow control valve 1211 is a motor valve configured such that the opening position of a valve body 1211a is controlled by the power of a driving source 1211b provided with a motor. The flow control valve 1211 may be any valve configured to adjust its opening position and may be another type of variable flow valve (for example, an electromagnetic valve driven by a solenoid or the like). The controller 1213 includes a control circuit such as a microcomputer and a memory configured to store control programs that are executed by the control circuit. The control circuit and the memory are mounted, for example, on a control board. The controller 1213 receives a flow rate set value iT of the fluid from the control device 150, receives a flow rate detection value io of the fluid from the flowmeter 1212, and performs feedback control of the flow control valve 1211 such that the flow rate detection value io becomes equal to the flow rate set value iT.

The foregoing illustrates the flow control valve unit (CLC) including the flowmeter, the flow control valve, and the controller, but a part or the entirety of these components may be provided separately. For example, the flowmeter 1212 and the flow control valve 1211 may be provided separately from each other, and the control device 150 may be configured to control the flow control valve 1211 to regulate the flow rate, based on the detection value from the flowmeter 1212, in place of the controller 1213 (or via the controller 1213). The control device 150 may be configured to appropriately control the flow control valve 1211 via another driving circuit.

The following describes a chemical supply process of supplying the cleaning chemical to the chemical cleaning module 220 by the chemical supply apparatus 100 shown in FIG. 2. In the case of supplying the cleaning chemical to the chemical cleaning module 220, in the chemical utility box 500A, the chemical inlet valve 52 is opened in the open state of the manual valve 51 to supply the chemical from the chemical supply source 20 to the chemical CLC 121. The flow rate of the chemical is measured in the chemical CLC 121 of the chemical utility box 500A, and the flow rate is controlled, based on this measurement value. A predetermined flow rate of the chemical is supplied from the chemical supply source 20 through the chemical CLC 121 via the meeting point 79 to the inline mixer 78.

Opening the DIW supply valve 86 on the DIW supply pipe 81 causes the DIW to be supplied from the DIW supply source 30 to the DIW CLC 111 of the DIW utility box 500D. The DIW CLC 111 measures the flow rate of the DIW and controls the flow rate based on this measurement value. Opening the DIW supply valve 112 causes the DIW to be supplied from the DIW CLC 111 via the meeting point 79 to the inline mixer 78. The chemical and the DIW are mixed in the inline mixer 78. The cleaning chemical produced by such mixing is supplied through the cleaning chemical pipe 96 to the chemical cleaning module 220.

(Time Chart)

Figure 4:
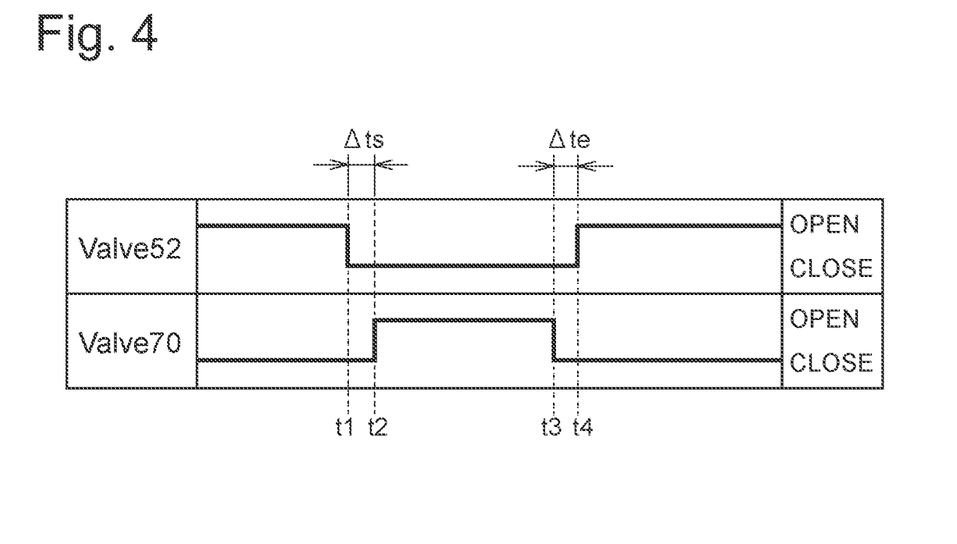
FIG. 4 is a time chart showing switchover timings of respective valves according to one embodiment.

FIG. 4 is a time chart showing switchover (switching) timings of the respective valves according to one embodiment. When pipe cleaning (flushing) of the chemical supply apparatus 100 and/or the cleaning apparatus 200 is performed after the chemical supply process of supplying the cleaning chemical to the chemical cleaning module 220 of the cleaning apparatus 200 by the chemical supply apparatus 100, in the chemical utility box 500A, the chemical inlet valve 52 is switched over from the open state to the closed state and the DIW inlet valve 70 is switched over from the closed state to the open state to supply the DIW to the chemical CLC 121. In the chemical supply apparatus 100 according to the embodiment, as described above, the conventional CLC box 120 and the conventional utility box 50 are integrated as the chemical utility box 500A. This achieves downsizing to shorten the distance between the chemical inlet valve 52 and the chemical CLC 121 and reduce the internal volume of the piping in this section. Accordingly, when the DIW inlet valve 70 is opened simultaneously with the chemical inlet valve 52 is closed, the DIW flows from the DIW inlet valve 70 into the small volume of the piping between the chemical inlet valve 52 and the chemical CLC 121 in the closed state of the chemical inlet valve 52, so as to cause an abrupt increase (spike) of the internal pressure of the piping in this section. As a result, the detection value of the flowmeter 1212 of the chemical CLC 121 is likely to overshoot and have a pressure upper limit error. The inflow of the liquid having a volume of even several cc ($cm^3$) into the small internal volume of the piping in the integrated module is expected to cause an abrupt pressure increase. As shown in FIG. 4, a predetermined delay time $\Delta ts$ (=t2−t1) is accordingly provided between a timing t1 when the chemical inlet valve 52 is closed and a timing t2 when the DIW inlet valve 70 is opened. According to one embodiment, the control device 150 controls the chemical inlet valve 52 and the DIW inlet valve 70, such as to first switch over the chemical inlet valve 52 from the open state to the closed state with keeping the DIW inlet valve 70 in the closed state and subsequently switch over the DIW inlet valve 70 from the closed state to the open state with keeping the chemical inlet valve 52 in the closed state after elapse of the predetermined delay time $\Delta ts$. Such control suppresses a pressure increase in the piping located in the piping pathway between the chemical inlet valve 52 and the DIW inlet valve 70 and thereby suppresses the occurrence of a pressure upper limit error of the flowmeter 1212 of the chemical CLC 121. According to one more favorable embodiment, it is preferable to open the chemical supply valve 122 (more specifically, switch over the chemical supply valve 122 from the closed state to the open state and subsequently operate the chemical supply valve 122 to the closed state again), simultaneously with or prior to the timing t1 when the chemical inlet valve 52 is closed. This is because the flow control valve 1211 of the chemical CLC 121 has a slight flow area even at a minimum opening position. Opening the chemical supply valve 122 simultaneously with or prior to the timing t1 when the chemical inlet valve 52 is closed enables the volume/the pressure of the piping between the chemical inlet valve 52 and the chemical CLC 121 to be slightly released toward a downstream side via the flow control valve 1211 and the chemical supply valve 122. This further suppresses a pressure increase in the internal volume of the piping between the chemical inlet valve 52 and the chemical CLC 121.

In the time chart of FIG. 4, at the start of pipe cleaning, the chemical inlet valve 52 is closed from the open state at a time t1, and the DIW inlet valve 70 is then opened from the closed state at a time t2 after the predetermined delay time $\Delta ts$. Controlling the open/close operations of the chemical inlet valve 52 and the DIW inlet valve 70 with providing the predetermined delay time $\Delta ts$ between the close timing t1 of the chemical inlet valve 52 and the open timing t2 of the DIW inlet valve 70 as described above enables a pressure increase in the internal volume of the piping between the chemical inlet valve 52 and the DIW CLC 111 due to closing of the chemical inlet valve 52 to be absorbed by the piping surface during the delay time $\Delta ts$ and/or to be released from the flow control valve 1211 toward the downstream side during the delay time $\Delta ts$. This suppresses an abrupt increase in the internal pressure of the piping in this section. Controlling the open/close operations of the chemical inlet valve 52 and the DIW inlet valve 70 with providing the delay time $\Delta ts$ causes the DIW inlet valve 70 to be opened after the chemical inlet valve 52 is certainly closed. This reliably eliminates a time period when the chemical inlet valve 52 and the DIW inlet valve 70 simultaneously have flow areas, and has an additional advantage of suppressing the DIW from the DIW inlet valve 70 from flowing back toward an upstream side of the chemical inlet valve 52.

The pressure increase in the piping between the chemical inlet valve 52 and the chemical CLC 121 by closing the chemical inlet valve 52 is expected to depend on the material of the piping (a PVC resin, a fluororesin or the like) between the chemical inlet valve 52 and the chemical CLC 121 and/or the supply capacities (the supply pressures and the supply flow rates) of the chemical inlet valve 52 and the DIW inlet valve 70, in addition to the distance (volume) of the piping between the chemical inlet valve 52 and the chemical CLC 121. Accordingly, the delay time $\Delta ts$ is set in advance by experiment and/or by computation (simulation or the like) in such a range that does not cause a pressure upper limit error of the flowmeter 1212 by taking into account the distance (volume) of the piping between the chemical inlet valve 52 and the chemical CLC 121, the material of the piping between the chemical inlet valve 52 and the chemical CLC 121, and/or the supply capacity (the supply pressure and the supply flow path) of the chemical inlet valve 52. From the viewpoint of the throughput of the apparatus, the shorter delay time is more preferable. In one example, the delay time is preferably not longer than 5 seconds in terms of the throughput. Accordingly, the delay time is determined in advance by experiment as a shortest possible time period in such a range that does not cause a pressure upper limit error of the flowmeter 1212. According to the embodiment, this delay time $\Delta ts$ is set to, for example, 0.1 second. According to one embodiment, a set value of the delay time $\Delta ts$ may be stored in advance in, for example, the recording medium 150b of the control device 150, and the program of the control device 150 may be configured to refer to this set value. According to one embodiment, a recipe including a set value of the delay time $\Delta ts$ may be stored in, for example, the recording medium 150b of the control device 150, and the program of the control device 150 may be configured to control a plurality of valves according to this recipe.

At the end of pipe cleaning, the process of closing the DIW inlet valve 70 and opening the chemical inlet valve 52 is also likely to cause a pressure increase in the piping between the DIW inlet valve 70 and the chemical CLC 121 and cause a pressure upper limit error of the flowmeter 1212. Accordingly, at the end of pipe cleaning, the DIW inlet valve 70 is closed at a time t3, and the chemical inlet valve 52 is opened at a time t4 after a predetermined delay time $\Delta te$ (=t4−t3) as shown in FIG. 4. Providing the delay time $\Delta te$ causes the chemical inlet valve 52 to be opened after the DIW inlet valve 70 is certainly closed. This reliably eliminates a time period when the chemical inlet valve 52 and the DIW inlet valve 70 simultaneously have flow areas, and has an additional advantage of suppressing the chemical from the chemical inlet valve 52 from flowing back toward the upstream side of the DIW inlet valve 70. According to one embodiment, a set value of the delay time $\Delta te$ may be stored in advance in, for example, the recording medium 150b of the control device 150, and the program of the control device 150 may be configured to refer to this set value. According to one embodiment, a recipe including a set value of the delay time $\Delta te$ may be stored in, for example, the recording medium 150b of the control device 150, and the program of the control device 150 may be configured to control a plurality of valves according to this recipe.

As in the case of starting pipe cleaning, at the end of pipe cleaning, the pressure increase in the piping between the DIW inlet valve 70 and the chemical CLC 121 by closing the DIW inlet valve 70 is expected to depend on the material of the piping (a PVC resin, a fluororesin or the like) between the DIW inlet valve 70 and the chemical CLC 121 and/or the supply capacities (the supply pressures and the supply flow rates) of the chemical inlet valve 52 and the DIW inlet valve 70, in addition to the distance (volume) of the piping between the DIW inlet valve 70 and the chemical CLC 121. Accordingly, the delay time Δte is set in advance by experiment and/or by computation (simulation or the like) in such a range that does not cause a pressure upper limit error of the flowmeter 1212 by taking into account the distance (volume) of the piping between the DIW inlet valve 70 and the chemical CLC 121, the material of the piping between the chemical inlet valve 52 and the chemical CLC 121 and the material of the piping between the DIW inlet valve 70 and the chemical CLC 121, and/or the supply capacities (the supply pressures and the supply flow rates) of the chemical inlet valve 52 and the DIW inlet valve 70. As in the case of starting pipe cleaning, the delay time is determined in advance by experiment and/or by computation (simulation or the like) as a shortest possible time period by taking into account the throughput in such a range that does not cause a pressure upper limit error of the flowmeter 1212. As a result, at the end of pipe cleaning, this suppresses an abrupt increase in the internal pressure in the piping between the DIW inlet valve 70 (the chemical inlet valve 52) and the chemical CLC 121 and suppresses a pressure upper limit error of the flowmeter 1212. The delay time Δte may be, for example, equal to the delay time Δts. According to this embodiment, the delay times Δts and Δte may be set to, for example, 0.1 second.

(Flowchart)

Figure 5:
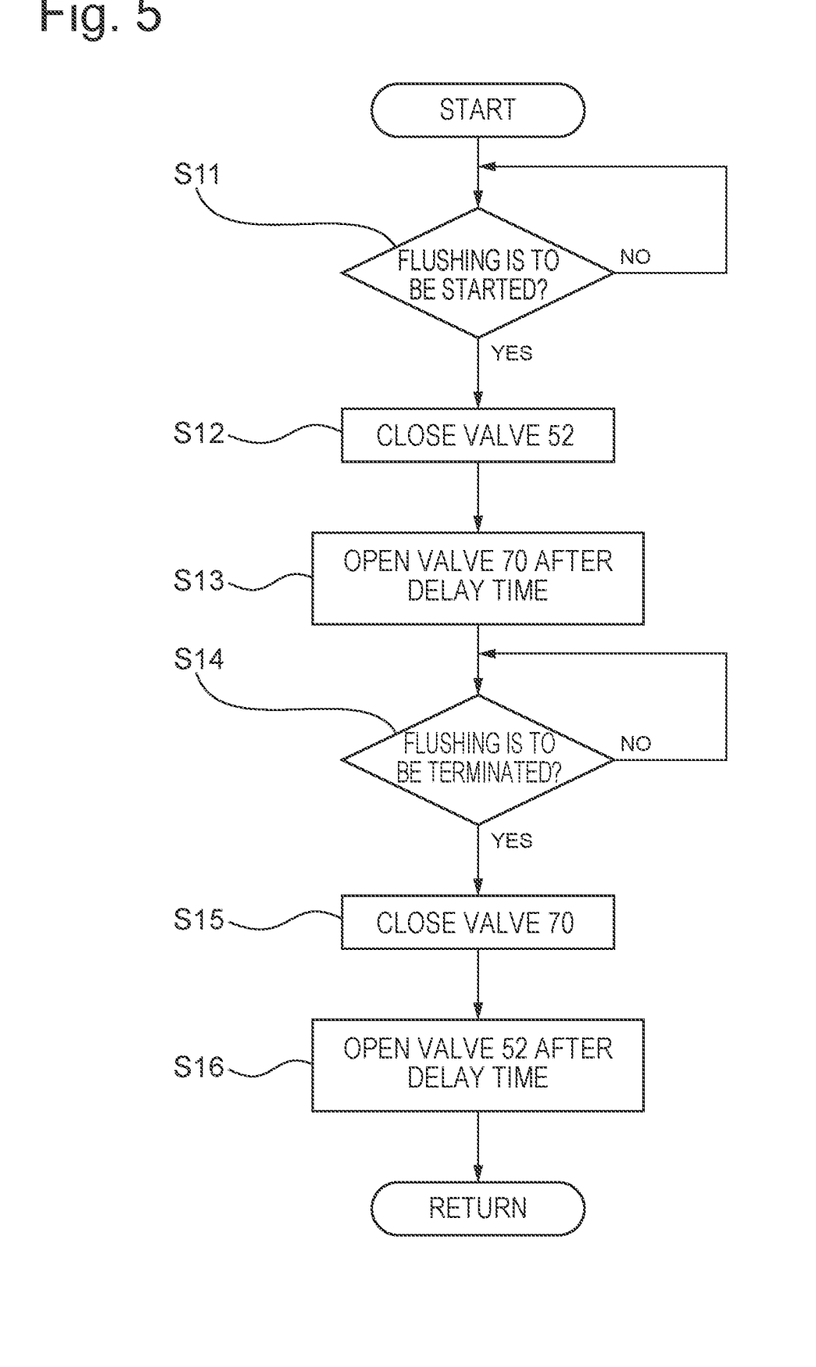
FIG. 5 is a flowchart showing a liquid switchover process according to one embodiment.

FIG. 5 is a flowchart showing a liquid switchover process according to one embodiment. This process is performed by the control device 150 or by the control device 150 in cooperation with another control device. The control device 150 may be, for example, a control device provided with respect to the chemical supply apparatus 100, may be a control device provided with respect to the cleaning unit 10, or may be a control device provided with respect to a substrate processing apparatus (a polishing apparatus or the like) where the cleaning unit 10 is provided. The control device 150 may include one or a plurality of control devices among, for example, a control device provided with respect to the chemical supply apparatus 100, a control device provided with respect to the cleaning unit 10 and a control device provided with respect to a substrate processing apparatus (a polishing apparatus or the like) where the cleaning unit 10 is provided.

At step S11, it is determined whether it is time to start pipe cleaning (flushing). For example, it is determined whether it is time to start pipe cleaning, based on a signal for starting pipe cleaning according to a predetermined program in the control device 150 and/or a control signal from outside of the control device 150. When it is not yet time to start pipe cleaning, the processing of step S11 is repeated until the time to start pipe cleaning comes. When it is determined that it is time to start pipe cleaning, the process proceeds to step S12.

At step S12, the chemical inlet valve 52 is closed from the open state (at the time t1 in FIG. 4). At step S13, the DIW inlet valve 70 is opened after elapse of the delay time Δts since the time when the chemical inlet valve 52 is closed (refer to time t2 in FIG. 4). This causes the DIW to be supplied from the DIW supply source 20 to the chemical CLC 121 and starts pipe cleaning.

At step S14, it is determined whether it is time to terminate pipe cleaning (flushing). For example, it is determined whether it is time to terminate pipe cleaning, based on a signal for terminating pipe cleaning according to a predetermined program in the control device 150 and/or a control signal from outside of the control device 150 (for example, from a controller of a substrate processing apparatus). When it is not yet time to terminate pipe cleaning, the processing of step S14 is repeated until the time to terminate pipe cleaning comes. When it is determined that it is time to terminate pipe cleaning, the process proceeds to step S15.

At step S15, the DIW inlet valve 70 is closed from the open state (at the time t3 in FIG. 4). At step S16, the chemical inlet valve 52 is opened after elapse of the delay time Δte since the time when the DIW inlet valve 70 is closed (refer to the time t4 in FIG. 4). This stops the supply of the DIW from the DIW supply source 20 to the chemical CLC 121 and terminates pipe cleaning.

The embodiment described above provides the delay times at the timings of the opening and closing operations of the chemical inlet valve 52 and the DIW inlet valve 70. This suppresses abrupt increases in the internal pressures of the pipings between the respective valves 52 and 70 and the chemical CLC 121 and suppresses a pressure upper limit error of the flowmeter 1212 of the chemical CLC 121.

OTHER EMBODIMENTS (1) The foregoing illustrates an example of integration in the chemical supply apparatus 100. The present disclosure is, however, also applicable to an integrated configuration other than the configuration of the chemical utility box 500A as shown in FIG. 2 or to another configuration of the liquid supply apparatus that is likely to have a measurement error of a sensor due to the supply capacity (the supply pressure and the supply flow rate) of a valve, the material of piping, and/or the volume of the piping.

(2) The configuration of integration of the chemical utility boxes 500A to 500C and the DIW utility box 500D is not limited to the above configuration. Part of the components of each utility box may not be integrated but may be placed outside of the utility box. Other components (valve(s), sensor(s), flow control valve(s) and the like) may be added and integrated.

(3) The foregoing illustrates an example of supplying the liquid to the cleaning apparatus by the liquid supply apparatus. For example, the cleaning apparatus 200 shown in FIG. 1 may be replaced with another liquid processing apparatus (a plating apparatus, an etching apparatus, a polishing apparatus, a developing apparatus or the like). In one example, one plating solution or a plurality of different plating solutions may be diluted and/or mixed and supplied from the liquid supply apparatus to a plating tank of a plating apparatus. In another example, one etching solution or a plurality of different etching solutions may be diluted and/or mixed and supplied from the liquid supply apparatus to an etching chamber of an etching apparatus. In another example, one developing solution or a plurality of different developing solutions may be diluted and/or mixed and supplied from the liquid supply apparatus to a developing chamber of a developing apparatus.

(4) In the above description, the delay times are set with respect to the timings of the opening and closing operations of the chemical inlet valve 52 and the DIW inlet valve 70 in such a range that does not cause a measurement value upper limit error of the flowmeter 1212. The delay times may, however, be set by additionally taking into account a pressure upper limit error of the pressure gauge 53 in FIG. 2. The present disclosure is also applicable to another configuration that is likely to cause a measurement error of a sensor due to the supply capacity (the supply pressure and the supply flow rate) of a valve, the material of piping, and/or the volume of the piping between apparatuses or devices. For example, the present disclosure is also applicable to a configuration of diluting or mixing liquids by switchover of respective valves. For example, delay times may be set with respect to the timings of the opening and closing operations of the DIW supply valve 112 and the chemical supply valve 122 such as not to cause a pressure upper limit error of the pressure gauge 74 in FIG. 2.

At least the following aspects are provided from the embodiments described above.

According to a first aspect, there is provided an apparatus for supplying liquid, comprising a flow controller configured to measure a flow rate of a liquid and control the flow rate based on a measurement value; a first valve connected with the flow controller to control supply of a first liquid to the flow controller; a second valve connected with the flow controller to control supply of a second liquid to the flow controller; and a control device configured to control the first valve and the second valve, wherein the control device switches over the first valve and the second valve with providing a delay time between an open/closed switchover time of the first valve and an open/closed switchover time of the second valve. The first valve and the second valve are, for example, on-off valves. The on-off valve may be, for example, an electromagnetic valve.

The apparatus of this aspect provides the delay time between the switchover time of the first valve and the switchover time of the second valve, so as to suppress a pressure increase/a flow rate increase in a piping between each of the valves and the flow controller and suppress a measurement value upper limit error (a pressure upper limit error/a flow rate upper limit error) of a sensor, such as a flowmeter of the flow controller. In the case where the piping between each of the valves and the flow controller has a short distance (a small volume), especially at the time of switchover of the first valve and the second valve, a pressure/a flow rate is likely to increase in the piping between each of the valves and the flow controller. The configuration of this aspect, however, provides the delay time between the switchover times of the respective valves, thus effectively suppressing a pressure increase/a flow rate increase in the piping in this section. In the case where respective components are integrated to achieve downsizing of the apparatus for supplying liquid, this configuration accordingly suppresses a measurement error (for example, a measurement value upper limit error) of a sensor due to the short distance (the small flow volume) between the respective components. As a result, this allows for integration of the respective components of the apparatus for supplying liquid and achieves downsizing of the apparatus for supplying liquid.

According to a second aspect, in the apparatus for supplying liquid of the first aspect, in a case of switching over between the supply of the first liquid and the supply of the second liquid to the flow controller, the control device may perform switchover from a closed state to an open state of the second valve after a first delay time elapsed since a time when the first valve is switched over from an open state to a closed state, and/or may perform switchover from the closed state to the open state of the second valve after a second delay time elapsed since a time when the second valve is switched over from the open state to the closed state.

The configuration of this aspect suppresses a pressure increase/a flow rate increase in the piping between each of the valves and the flow controller in the case of switching over between the supply of the first liquid and the supply of the second liquid to the flow controller and suppresses a measurement value upper limit error of a sensor, such as a flowmeter of the flow controller.

According to a third aspect, in the apparatus for supplying liquid of either the first aspect or the second aspect, the flow controller may comprise a flowmeter; and a flow control valve configured to control a flow rate of the first liquid and/or the second liquid, based on a measurement value by the flowmeter. The delay time may be set to a time period that does not cause a measurement value upper limit error of the flowmeter at a time when the first valve and/or the second valve are switched over.

In the apparatus of this aspect, a range where no measurement value upper limit error of the flow controller, such as a CLC, occurs is set in advance by experiment, by computation or the like (in one example, the range is stored/set in a memory (recording medium) of, for example, a control device of an apparatus for processing a substrate or the apparatus for supplying liquid or in a memory (recording medium) that is readable by, for example, the control device of the apparatus for processing the substrate or the apparatus for supplying liquid). This suppresses a measurement value upper limit error of the flowmeter.

According to a fourth aspect, in the apparatus for supplying liquid of the third aspect, the flowmeter may be a differential pressure-type flowmeter or an ultrasonic flowmeter.

The configuration of this aspect suppresses a pressure upper limit error in the differential pressure-type flowmeter or a flow rate upper limit error in the ultrasonic flowmeter.

According to a fifth aspect, in the apparatus for supplying liquid of any one of the first aspect to the fourth aspect, the flow controller, the first valve and the second valve may be placed in one single module.

The configuration of this aspect allows for integration in a single module. This suppresses an abrupt increase in an internal pressure of the piping due to switchover of the valves and suppresses a measurement error of a sensor even in a configuration that has a short distance between each of the valves and the flow controller.

According to a sixth aspect, the apparatus for supplying liquid of any one of the first aspect to the fifth aspect may further comprise one or a plurality of pressure gauges configured to measure at least one of a supply pressure of the first liquid from a first liquid supply source connected with the first valve and a supply pressure of the second liquid from a second liquid supply source connected with the second valve.

The configuration of this aspect suppresses a measurement error (for example, a measurement value upper limit error) of one or the plurality of pressure gauges configured to measure the supply pressure of the first liquid and/or the supply pressure of the second liquid.

According to a seventh aspect, there is provided a cleaning unit comprising the apparatus for supplying liquid of any one of the first aspect to the sixth aspect; and an apparatus for cleaning connected with the apparatus for supplying liquid.

The configuration of this aspect has the functions and the advantageous effects described above with respect to the apparatus for supplying liquid in the apparatus for cleaning.

According to an eighth aspect, in the cleaning unit of the seventh aspect, the first liquid may be a chemical used in the apparatus for cleaning, and the second liquid may be a second chemical or pure water used to clean a flow path of the apparatus for supplying liquid.

The configuration of this aspect suppresses a pressure increase in the piping at the start of pipe cleaning and/or at the end of pipe cleaning in the cleaning unit and suppresses the occurrence of a measurement error of a sensor.

According to a ninth aspect, there is provided an apparatus for processing a substrate, comprising the cleaning unit of either the seventh aspect or the eight aspect.

The configuration of this aspect has the functions and the advantageous effects described above with respect to the cleaning unit of an apparatus for processing a substrate (a plating apparatus, an etching apparatus, a polishing apparatus, a developing apparatus or the like).

According to a tenth aspect, there is provided an apparatus for processing a substrate comprising: the apparatus for supplying liquid of any one of the first aspect to the sixth aspect; and an apparatus for processing liquid connected with the apparatus for supplying liquid, wherein the first liquid is a third chemical used in the apparatus for processing liquid, and the second liquid is a fourth chemical or pure water used in the apparatus for processing liquid.

The configuration of this aspect suppresses a pressure increase in the piping due to switchover of the valves in the case of diluting and/or mixing chemicals and suppresses the occurrence of a measurement error of a sensor in the apparatus for processing liquid.

According to an eleventh aspect, there is provided a method of supplying a liquid, comprising: a process of switching over between an open state and a closed state of a first valve configured to control supply of a first liquid to a flow controller; and a process of switching over between an open state and a closed state of a second valve configured to control supply of a second liquid to the flow controller, wherein the switchover between the open state and the closed state of the second valve is performed after a predetermined delay time elapsed since a time when the switchover between the open state and the closed state of the first valve is performed.

The configuration of this aspect has similar functions and advantageous effects to those of the first aspect.

According to a twelfth aspect, there is provided a non-transitory computer readable recording medium configured to store therein a program that causes a computer to perform processing. The processing comprises a process of switching over between an open state and a closed state of a first valve configured to control supply of a first liquid to a flow controller; and a process of switching over between an open state and a closed state of a second valve configured to control supply of a second liquid to the flow controller after a predetermined delay time elapsed since a time when the switchover between the open state and the closed state of the first valve is performed.

The configuration of this aspect has similar functions and advantageous effects to those of the first aspect.

Although the embodiments of the present invention have been described based on some examples, the embodiments of the invention described above are presented to facilitate understanding of the present invention, and do not limit the present invention. The present invention can be altered and improved without departing from the subject matter of the present invention, and it is needless to say that the present invention includes equivalents thereof. In addition, it is possible to arbitrarily combine or omit respective constituent elements described in the claims and the specification in a range where at least a part of the above-mentioned problem can be solved or a range where at least a part of the effect is exhibited.

The present application claims priority to Japanese patent application No. 2019-074141 filed on Apr. 9, 2019. The entire disclosure of Japanese patent application No. 2019-074141 filed on Apr. 9, 2019, including the specification, claims, drawings and abstract is incorporated herein by reference in its entirety.

The entire disclosure of Japanese Unexamined Patent Publication No. 2018-181883 (Patent Document 1), including the specification, claims, drawings and abstract is incorporated herein by reference in its entirety.

REFERENCE SIGNS LIST 10 cleaning unit
20 chemical supply source
30 DIW supply source
51 manual valve
52 chemical inlet valve
53 pressure gauge
70 DIW inlet valve
74 pressure gauge
76 pressure gauge
77 DIW pressure control regulator
78 inline mixer
81 DIW supply pipe
82 DIW branch pipe
83 DIW pipe
86 DIW supply valve
87 DIW pressure control regulator
88 DIW pressure gauge
91 chemical pipe
93 chemical pipe
96 cleaning chemical pipe
111 DIW CLC
112 DIW supply valve
121 chemical CLC
122 chemical supply valve
100 chemical supply apparatus
101 housing
110 CLC box
120 CLC box
150 control device
200 cleaning apparatus
210 DIW cleaning module
220 chemical cleaning module
230 cleaning tank
500A-500C chemical utility boxes
500D DIW utility box
1211 flow control valve (internal control valve)
1211a valve body
1211b driving source
1212 flowmeter
1213 controller

The invention claimed is:

1. A method of supplying a liquid by an apparatus for supplying liquid, wherein the apparatus for supplying liquid comprises:

a first flow controller configured to measure a flow rate of a liquid and control the flow rate based on a measurement value; a first valve connected with a chemical supply source and with the first flow controller, the first valve controlling supply of a chemical to the first flow controller;

a second valve connected with a pure water supply source and with the first flow controller, the second valve controlling supply of a pure water to the first flow controller;

a third valve connected with an output-side of the first flow control valve; a second flow controller connected with the pure water supply source and configured to measure a flow rate of the pure water and control the flow rate based on a measurement value;

a fourth valve connected with an output-side of the second flow controller;

a mixer connected with the third and fourth valves and configured to mix the chemical from the first flow control valve and the pure water from the second flow control valve;

a pressure gauge connected with an output-side of the mixer; and a control device configured to control the first to fourth valves and the first and second flow controller, wherein the first and second flow controllers comprise a flowmeter configured by either a differential pressure-type flowmeter or an ultrasonic flowmeter configured to measure the flow rate of the chemical or the pure water; and a flow control valve configured to control a flow rate of the chemical or a flow rate of the pure water to a set flow rate by feedback control based on a measurement value of the flowmeter, the method comprising:

a process of starting flushing to clean a piping with the pure water by performing switchover from a closed state to an open state of the second valve after a first delay time elapsed since a time when the first valve is switched over from an open state to a closed state;

a process of terminating the flushing by performing switchover from the closed state to the open state of the first valve after a second delay time elapsed since a time when the second valve is switched over from the open state to the closed state; and a process of switching over the third valve and the fourth valve with providing a third delay time between an open/closed switchover time of the third valve and an open/closed switchover time of the fourth valve to dilute the chemical with the pure water at the mixer such as not to cause a pressure upper limit error of the pressure gauge.

2. The method of supplying a liquid according to claim 1, wherein the apparatus for supplying liquid comprises a pure water supply pipe connected with the pure water supply source, and the pure water supply pipe branches into:

a first pipe configured to supply the pure water directly from the pure water supply source to a cleaning unit;

a second pipe connected with the second flow controller to supply the pure water to dilute the chemical; and a third pipe connected with the first flow controller via the second valve to supply the pure water to perform the flushing.

3. The method of supplying a liquid according to claim 1, wherein the process further comprises a process of closing the third valve and the fourth valve with providing a fourth delay time between an open/closed switchover time of the third valve and an open/closed switchover time of the fourth valve, such as not to cause a pressure upper limit error of the pressure gauge.

4. A cleaning unit, comprising:

a first flow controller configured to measure a flow rate of a liquid and control the flow rate based on a measurement value;

a first valve connected with a chemical supply source and with the first flow controller, the first valve controlling supply of a chemical to the first flow controller;

a second valve connected with a pure water supply source and with the first flow controller, the second valve controlling supply of a pure water to the first flow controller;

a third valve connected with an output-side of the first flow control valve;

a second flow controller connected with the pure water supply source and configured to measure a flow rate of the pure water and control the flow rate based on a measurement value;

a fourth valve connected with an output-side of the second flow controller;

a mixer connected with the third and fourth valves and configured to mix the chemical from the first flow control valve and the pure water from the second flow control valve;

a pressure gauge connected with an output-side of the mixer; and a control device configured to control the first, second, third and fourth valves and the first and second flow controllers, wherein the first and second flow controllers comprise a flowmeter configured by either a differential pressure-type flowmeter or an ultrasonic flowmeter configured to measure the flow rate of the chemical or the pure water; and a flow control valve configured to control a flow rate of the chemical or a flow rate of the pure water to a set flow rate by feedback control based on a measurement value of the flowmeter, the control device is configured to determine whether it is time to start flushing to clean a piping with the pure water and whether it is time to terminate the flushing, when the control device determines that it is time to start flushing, the control device starts the flushing by performing switchover from a closed state to an open state of the second valve after a first delay time elapsed since a time when the first valve is switched over from an open state to a closed state; and when the control device determines that it is time to terminate the flushing, the control device terminates the flushing by performing switchover from the closed state to the open state of the first valve after a second delay time elapsed since a time when the second valve is switched over from the open state to the closed state, and in case of diluting the chemical with the pure water at the mixer, the control device switches over the third valve and the fourth valve with providing a third delay time between an open/closed switchover time of the third valve and an open/closed switchover time of the fourth valve such as not to cause a pressure upper limit error of the pressure gauge; and an apparatus for cleaning in fluid communication with the mixer and configured to receive the flow of mixed chemical and pure water from the mixer.

5. An apparatus for processing a substrate, comprising:

a first flow controller configured to measure a flow rate of a liquid and control the flow rate based on a measurement value;

a first valve connected with a chemical supply source and with the first flow controller, the first valve controlling supply of a chemical to the first flow controller;

a second valve connected with a pure water supply source and with the first flow controller, the second valve controlling supply of a pure water to the first flow controller;

a third valve connected with an output-side of the first flow control valve;

a second flow controller connected with the pure water supply source and configured to measure a flow rate of the pure water and control the flow rate based on a measurement value;

a fourth valve connected with an output-side of the second flow controller;

a mixer connected with the third and fourth valves and configured to mix the chemical from the first flow control valve and the pure water from the second flow control valve;

a pressure gauge connected with an output-side of the mixer; and a control device configured to control the first, second, third and fourth valves and the first and second flow controllers, wherein the first and second flow controllers comprise a flowmeter configured by either a differential pressure-type flowmeter or an ultrasonic flowmeter configured to measure the flow rate of the chemical or the pure water; and a flow control valve configured to control a flow rate of the chemical or a flow rate of the pure water to a set flow rate by feedback control based on a measurement value of the flowmeter, the control device is configured to determine whether it is time to start flushing to clean a piping with the pure water and whether it is time to terminate the flushing, when the control device determines that it is time to start flushing, the control device starts the flushing by performing switchover from a closed state to an open state of the second valve after a first delay time elapsed since a time when the first valve is switched over from an open state to a closed state; and when the control device determines that it is time to terminate the flushing, the control device terminates the flushing by performing switchover from the closed state to the open state of the first valve after a second delay time elapsed since a time when the second valve is switched over from the open state to the closed state, and in case of diluting the chemical with the pure water at the mixer, the control device switches over the third valve and the fourth valve with providing a third delay time between an open/closed switchover time of the third valve and an open/closed switchover time of the fourth valve such as not to cause a pressure upper limit error of the pressure gauge; and an apparatus for cleaning a substrate in fluid communication with the mixer and configured to receive the flow of mixed chemical and pure water from the mixer.

6. A non-transitory computer readable recording medium configured to store therein a program that causes a computer to perform a process of supplying a liquid by an apparatus for supplying liquid, wherein the apparatus for supplying liquid comprises:

a first flow controller configured to measure a flow rate of a liquid and control the flow rate based on a measurement value;

a first valve connected with a chemical supply source and with the first flow controller, the first valve controlling supply of a chemical to the first flow controller;

a second valve connected with a pure water supply source and with the first flow controller, the second valve controlling supply of a pure water to the first flow controller;

a third valve connected with an output-side of the first flow control valve; a second flow controller connected with the pure water supply source and configured to measure a flow rate of the pure water and control the flow rate based on a measurement value;

a fourth valve connected with an output-side of the second flow controller; a mixer connected with the third and fourth valves and configured to mix the chemical from the first flow control valve and the pure water from the second flow control valve; a pressure gauge connected with an output-side of the mixer; and a control device configured to control the first to fourth valves and the first and second flow controller, wherein the first and second flow controllers comprise a flowmeter configured by either a differential pressure-type flowmeter or an ultrasonic flowmeter configured to measure the flow rate of the chemical or the pure water; and a flow control valve configured to control a flow rate of the chemical or a flow rate of the pure water to a set flow rate by feedback control based on a measurement value of the flowmeter, wherein the process comprises:

a process of starting flushing to clean a piping with the pure water by performing switchover from a closed state to an open state of the second valve after a first delay time elapsed since a time when the first valve is switched over from an open state to a closed state;

a process of terminating the flushing by performing switchover from the closed state to the open state of the first valve after a second delay time elapsed since a time when the second valve is switched over from the open state to the closed state; and a process of switching over the third valve and the fourth valve with providing a third delay time between an open/closed switchover time of the third valve and an open/closed switchover time of the fourth valve to dilute the chemical with the pure water at the mixer such as not to cause a pressure upper limit error of the pressure gauge.

7. The non-transitory computer readable recording medium according to claim 6, wherein the apparatus for supplying liquid comprises a pure water supply pipe connected with the pure water supply source, and the pure water supply pipe branches into:

a first pipe configured to supply the pure water directly from the pure water supply source to a cleaning unit;

a second pipe connected with the second flow controller to supply the pure water to dilute the chemical; and a third pipe connected with the first flow controller via the second valve to supply the pure water to perform the flushing.

8. The non-transitory computer readable recording medium according to claim 6, wherein the process further comprises a process of closing the third valve and the fourth valve with providing a fourth delay time between an open/closed switchover time of the third valve and an open/closed switchover time of the fourth valve, such as not to cause a pressure upper limit error of the pressure gauge.

9. An apparatus for supplying liquid, comprising:
a first flow controller configured to measure a flow rate of a liquid and control the flow rate based on a measurement value;
a first valve connected with a chemical supply source and with the first flow controller, the first valve controlling supply of a chemical to the first flow controller;
a second valve connected with a pure water supply source and with the first flow controller, the second valve controlling supply of a pure water to the first flow controller;
a third valve connected with an output-side of the first flow control valve;
a second flow controller connected with the pure water supply source and configured to measure a flow rate of the pure water and control the flow rate based on a measurement value;
a fourth valve connected with an output-side of the second flow controller;
a mixer connected with the third and fourth valves and configured to mix the chemical from the first flow control valve and the pure water from the second flow control valve;
a pressure gauge connected with an output-side of the mixer; and
a control device configured to control the first, second, third and fourth valves and the first and second flow controllers,
wherein the first and second flow controllers comprise a flowmeter configured by either a differential pressure-type flowmeter or an ultrasonic flowmeter configured to measure the flow rate of the chemical or the pure water; and
a flow control valve configured to control a flow rate of the chemical or a flow rate of the pure water to a set flow rate by feedback control based on a measurement value of the flowmeter, the control device is configured to determine whether it is time to start flushing to clean a piping with the pure water and whether it is time to terminate the flushing,
when the control device determines that it is time to start flushing, the control device starts the flushing by performing switchover from a closed state to an open state of the second valve after a first delay time elapsed since a time when the first valve is switched over from an open state to a closed state; and
when the control device determines that it is time to terminate the flushing, the control device terminates the flushing by performing switchover from the closed state to the open state of the first valve after a second delay time elapsed since a time when the second valve is switched over from the open state to the closed state, and in case of diluting the chemical with the pure water at the mixer, the control device switches over the third valve and the fourth valve with providing a third delay time between an open/closed switchover time of the third valve and an open/closed switchover time of the fourth valve such as not to cause a pressure upper limit error of the pressure gauge.

10. The apparatus for supplying liquid according to claim 9,
wherein the first and second delay times are set to a time period that does not cause a measurement value upper limit error of the flowmeter at a time when the first valve and/or the second valve are switched over.

11. The apparatus for supplying liquid according to claim 9,
wherein the first flow controller, the first valve and the second valve are placed in one single module.

12. The apparatus for supplying liquid according to claim 9, further comprising:
one or a plurality of pressure gauges configured to measure at least one of a supply pressure of the chemical from the chemical supply source to the first flow control device and a supply pressure of the pure water from the pure water supply source to the first flow controller.

13. The apparatus for supplying liquid according to claim 9,
wherein the apparatus for supplying liquid comprises a pure water supply pipe connected with the pure water supply source, and
the pure water supply pipe branches into:
a first pipe configured to supply the pure water directly from the pure water supply source to a cleaning unit;
a second pipe connected with the second flow controller to supply the pure water to dilute the chemical; and
a third pipe connected with the first flow controller via the second valve to supply the pure water to perform the flushing.

14. The apparatus for supplying liquid according to claim 9, wherein the control device closes the third valve and the fourth valve with providing a fourth delay time between an open/closed switchover time of the third valve and an open/closed switchover time of the fourth valve, such as not to cause a pressure upper limit error of the pressure gauge.

15. The apparatus for supplying liquid according to claim 9,
wherein the first flow controller comprising the flowmeter and the flow control valve, the first valve, and the second valve are integrated in one chemical utility box.

16. The apparatus for supplying liquid according to claim 15,
wherein the first and second delay times are 0.1 second.

* * * * *